(12) United States Patent
Leobandung

(10) Patent No.: US 9,735,273 B1
(45) Date of Patent: Aug. 15, 2017

(54) METHOD OF FORMING A III-V COMPOUND SEMICONDUCTOR CHANNEL POST REPLACEMENT GATE

(71) Applicant: International Business Machines Corporation, Armonk, NY (US)

(72) Inventor: Effendi Leobandung, Stormville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/095,477

(22) Filed: Apr. 11, 2016

(51) Int. Cl.
| | |
|---|---|
| *H01L 21/00* | (2006.01) |
| *H01L 29/00* | (2006.01) |
| *H01L 29/78* | (2006.01) |
| *H01L 29/66* | (2006.01) |
| *H01L 29/08* | (2006.01) |

(Continued)

(52) U.S. Cl.
CPC .... *H01L 29/7848* (2013.01); *H01L 21/02529* (2013.01); *H01L 21/02532* (2013.01); *H01L 21/02543* (2013.01); *H01L 21/02546* (2013.01); *H01L 21/02636* (2013.01); *H01L 21/3081* (2013.01); *H01L 29/0847* (2013.01); *H01L 29/165* (2013.01); *H01L 29/205* (2013.01); *H01L 29/6653* (2013.01); *H01L 29/6656* (2013.01); *H01L 29/66522* (2013.01); *H01L 29/66545* (2013.01); *H01L 29/66795* (2013.01); *H01L 29/785* (2013.01)

(58) Field of Classification Search
CPC ......... H01L 21/02543; H01L 21/02532; H01L 21/02529; H01L 21/3081; H01L 21/02546; H01L 21/02636; H01L 29/7848; H01L 29/785; H01L 29/6656; H01L 29/66522; H01L 29/66547; H01L 29/66795; H01L 29/66545; H01L 29/205; H01L 29/165

See application file for complete search history.

(56) References Cited

U.S. PATENT DOCUMENTS

| | | | |
|---|---|---|---|
| 8,969,201 B2 * | 3/2015 | Wang | H01L 23/485 257/E21.167 |
| 9,059,288 B2 * | 6/2015 | Cheng | H01L 29/785 |

(Continued)

*Primary Examiner* — Nikolay Yushin
(74) *Attorney, Agent, or Firm* — Scully, Scott, Murphy & Presser, P.C.; Louis J. Percello

(57) ABSTRACT

After forming a sacrificial gate structure straddling a stacking of a semiconductor mandrel structure and a dielectric mandrel cap and spacers present on sidewalls of the stack, portions of the spacers located on opposite sides of the sacrificial gate structure are removed. Epitaxial source/drain regions are formed on exposed sidewalls of portions of the semiconductor mandrel structure located on opposite sides of the sacrificial gate structure. The sacrificial gate structure is removed to provide a gate cavity. Next, portions of the spacers exposed by the gate cavity are removed to expose sidewalls of a portion of the semiconductor mandrel structure. III-V compound semiconductor channel portions are then formed on exposed sidewalls of the semiconductor mandrel structure. Portions of the semiconductor mandrel structure and the dielectric mandrel cap exposed by the gate cavity are subsequently removed from the structure, leaving only the III-V compound semiconductor channel portions.

14 Claims, 14 Drawing Sheets

(51) Int. Cl.
*H01L 21/308* (2006.01)
*H01L 21/02* (2006.01)
*H01L 29/205* (2006.01)
*H01L 29/165* (2006.01)

(56) References Cited

U.S. PATENT DOCUMENTS

| | | | |
|---|---|---|---|
| 9,099,412 B2 * | 8/2015 | Leobandung | H01L 21/324 |
| 2014/0377918 A1 * | 12/2014 | Cheng | H01L 29/785 |
| | | | 438/163 |
| 2014/0377925 A1 * | 12/2014 | Leobandung | H01L 21/324 |
| | | | 438/285 |

* cited by examiner

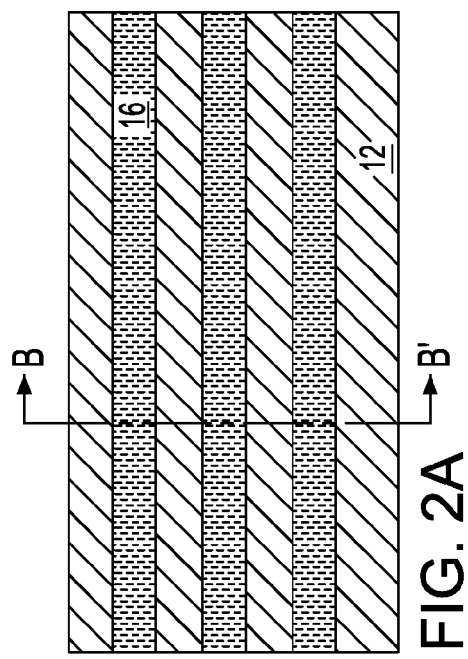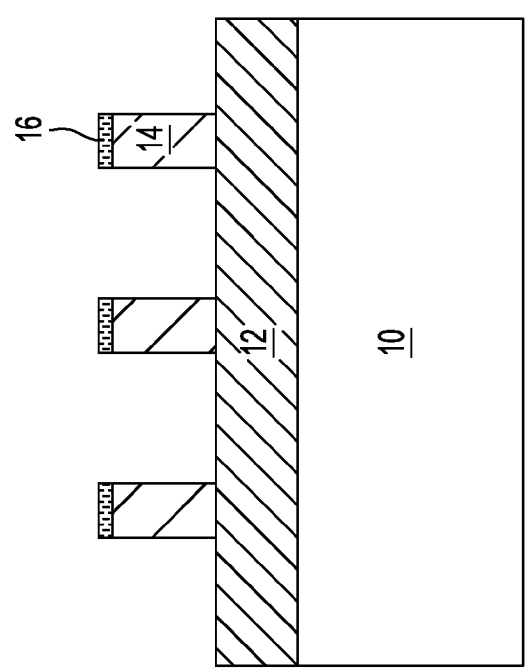

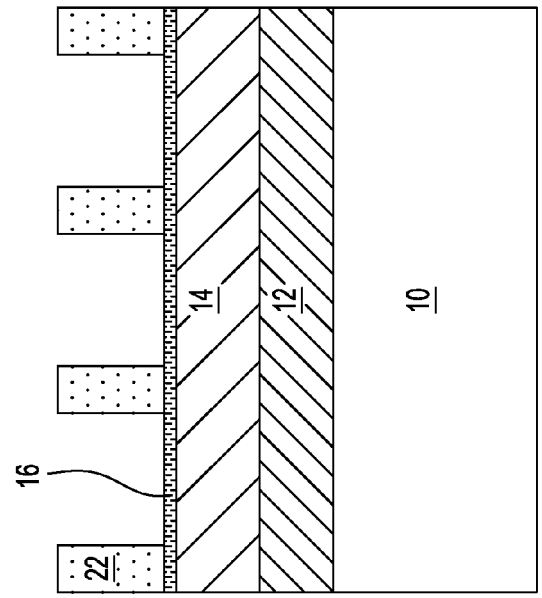
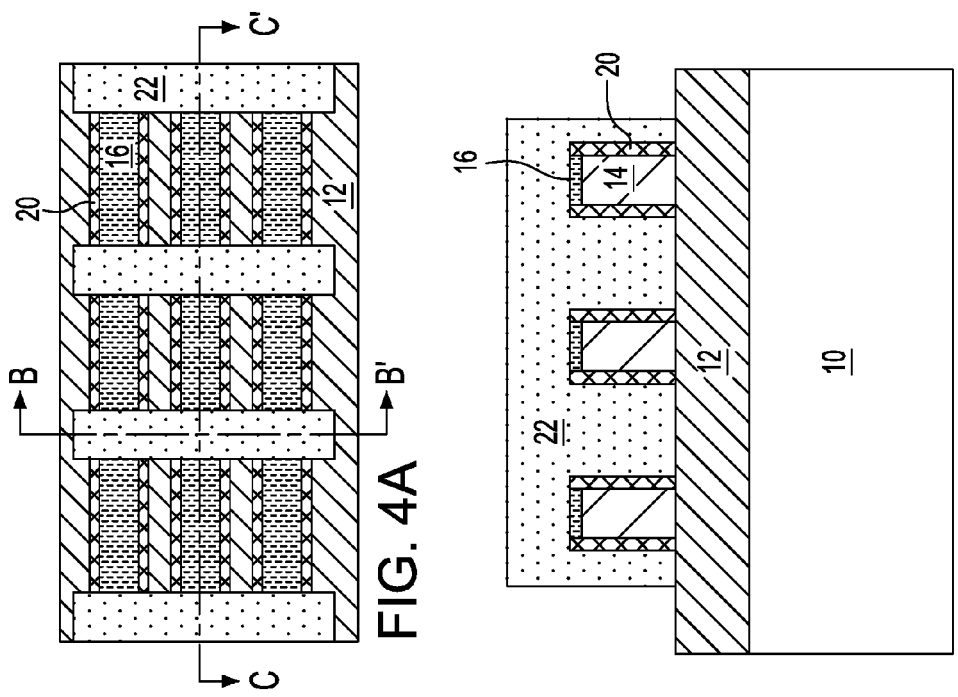
FIG. 4A  FIG. 4B  FIG. 4C

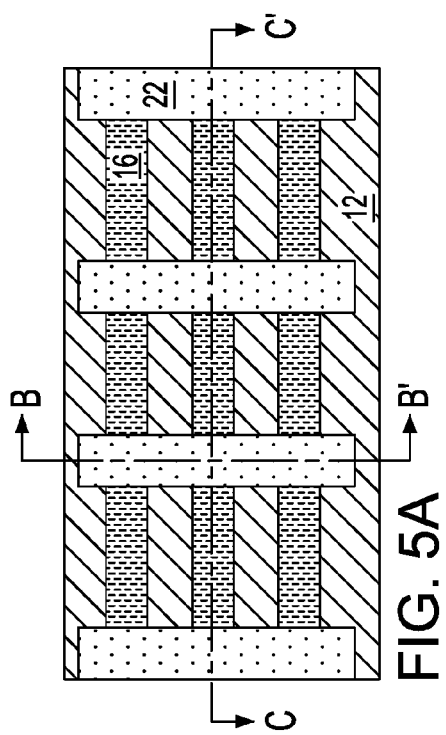
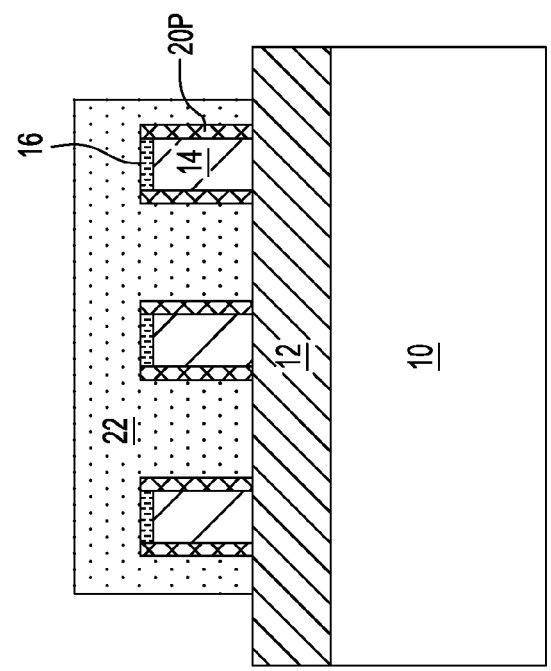
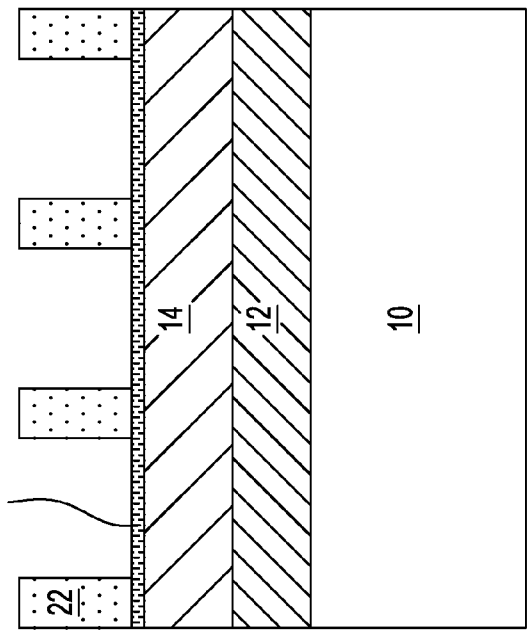
FIG. 5A
FIG. 5B
FIG. 5C

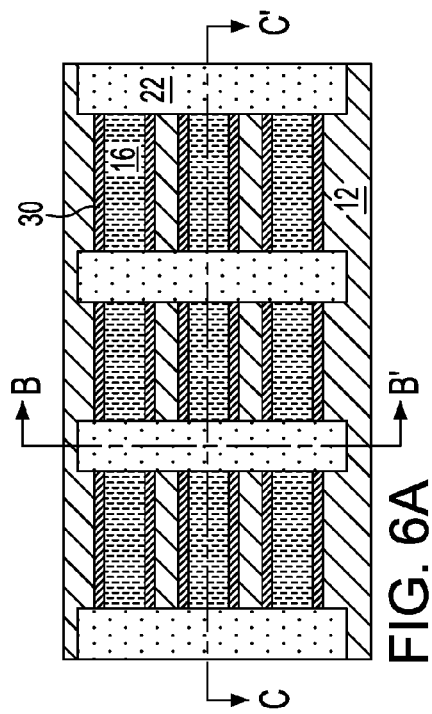
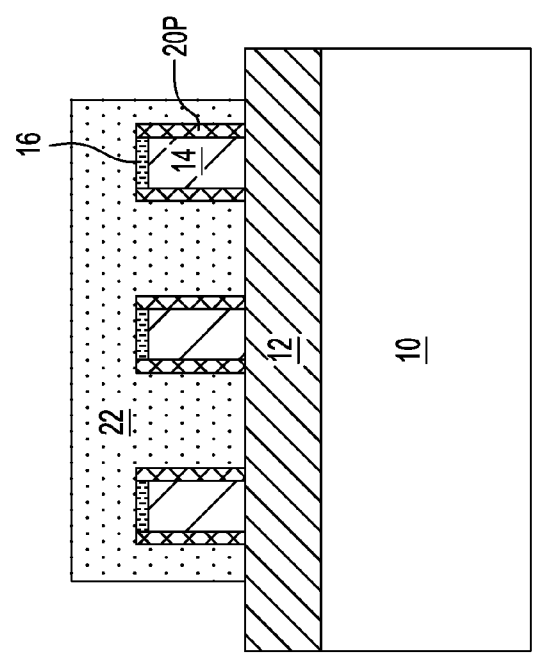
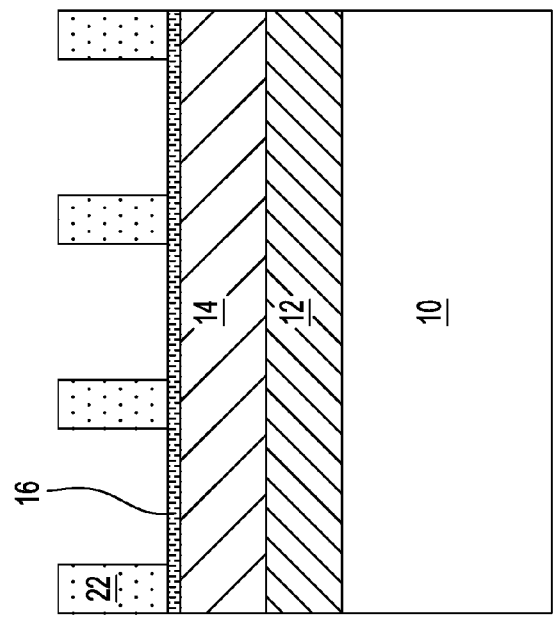

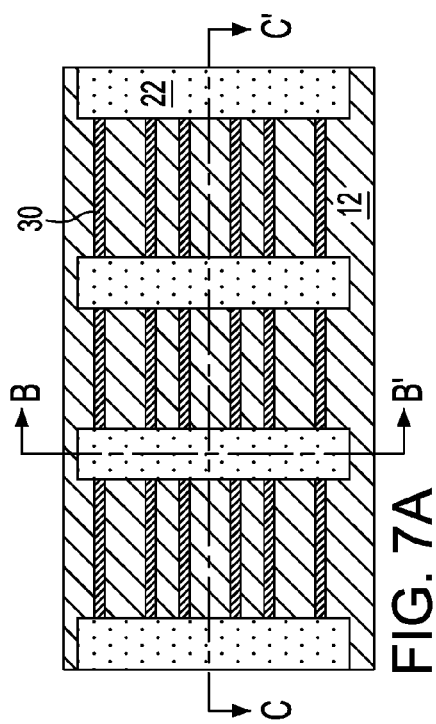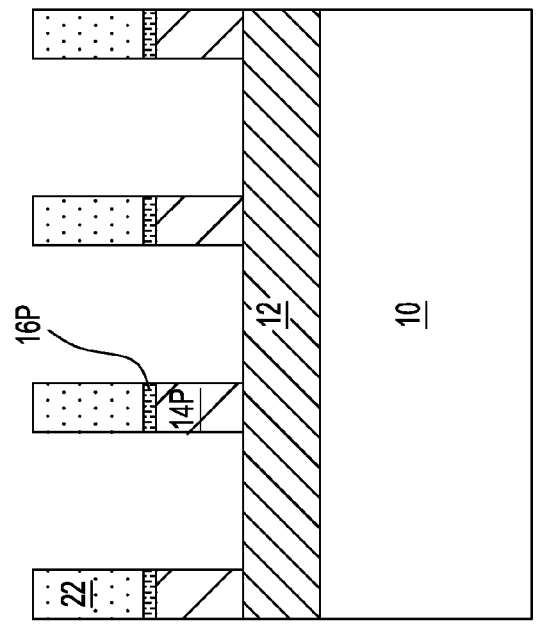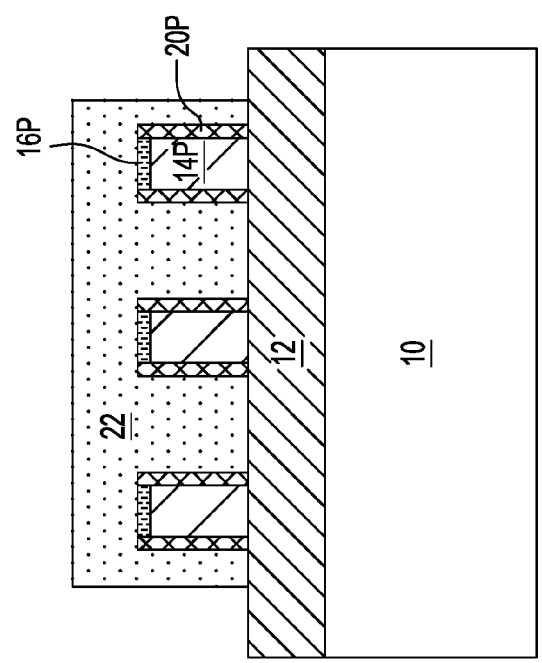

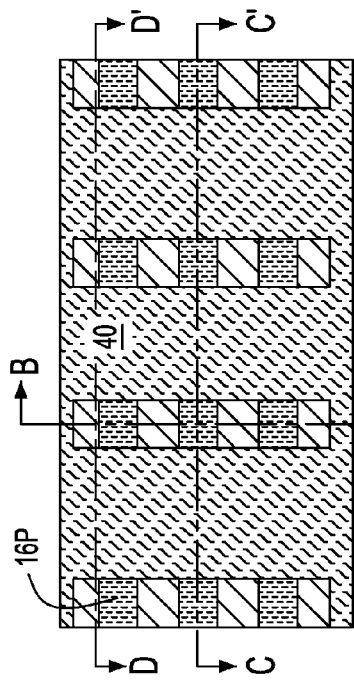
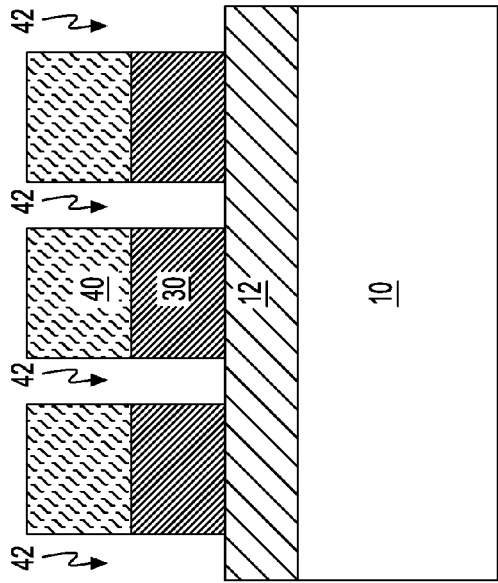
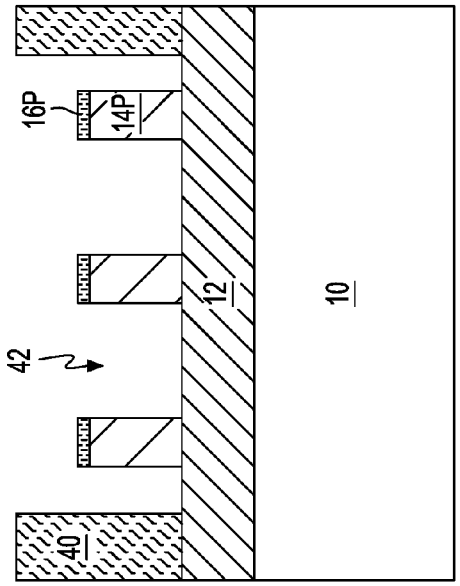
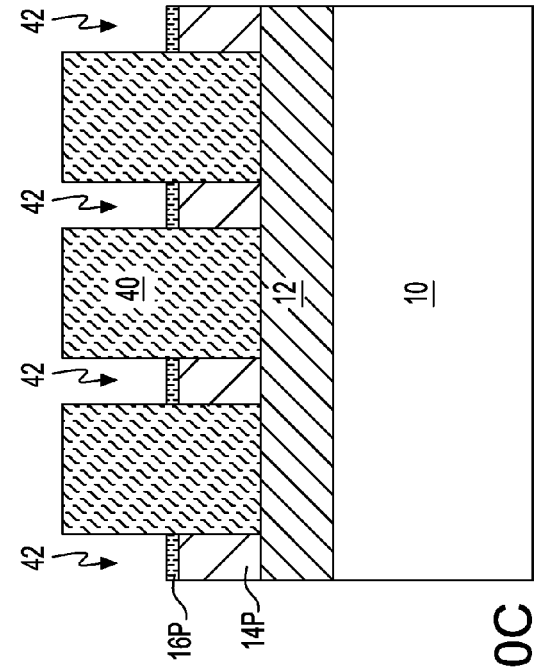
FIG. 10A
FIG. 10B
FIG. 10C
FIG. 10D

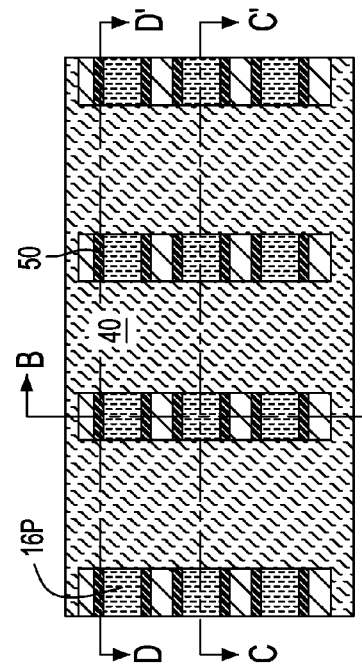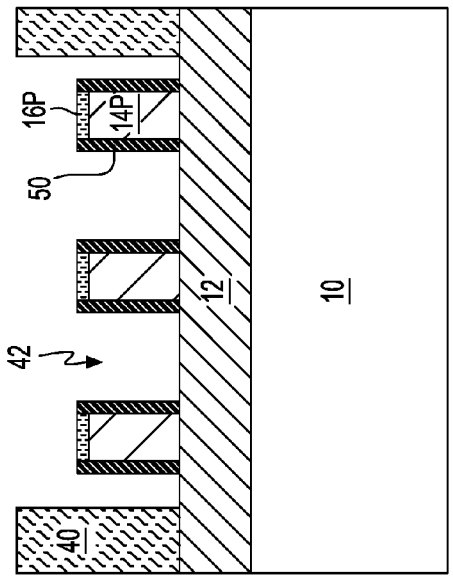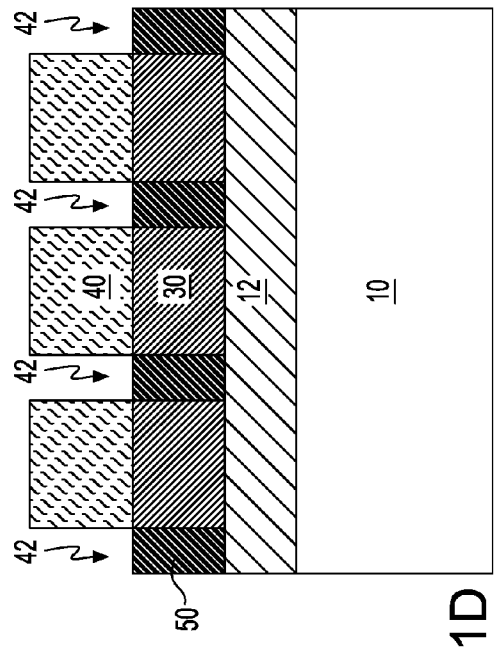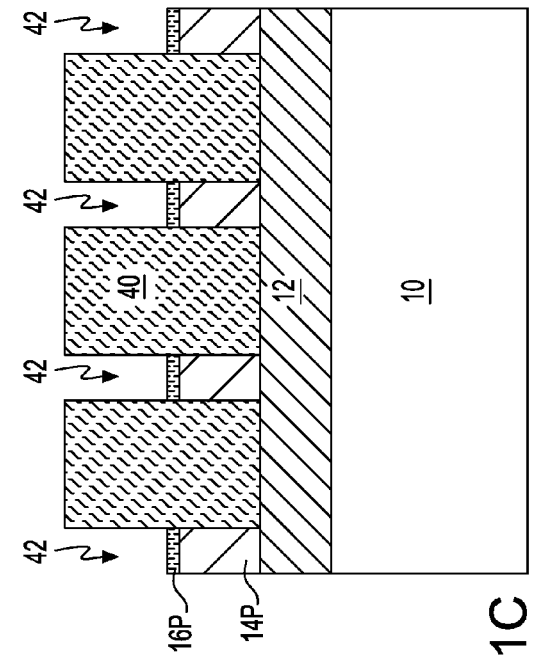
FIG. 11A
FIG. 11B
FIG. 11D
FIG. 11C

METHOD OF FORMING A III-V COMPOUND SEMICONDUCTOR CHANNEL POST REPLACEMENT GATE

BACKGROUND

The present application relates to semiconductor device fabrication, and more particularly to a method of forming fin-type field effect transistors (FinFETs) including compound semiconductor fins.

As silicon-based semiconductor devices scale down to atomic-scale limits, they are running out of ways to increase performance and lower power consumption. By integrating higher performance materials with silicon, such as III-V compound semiconductor materials that provide higher carrier velocity and higher drive current, the hybrid semiconductor devices enable continued scaling beyond the capabilities of silicon alone.

Growing III-V compound semiconductor materials on sidewalls of silicon mandrel structures has been shown as a promising approach to grow defect-free III-V compound semiconductor fins on silicon. Following formation of the sidewall fins, the mandrel structures are selectively removed, leaving only the sidewall fins. However, when the feature sizes in integrated circuits continue to decrease, removal of the mandrel structures can cause sidewall fins to collapse. To prevent the collapse of the sidewall fins, the sidewalls fins need to be anchored at the ends. The presence of the anchoring structures leads to a decrease in device density in integrated circuits. Therefore, a method of forming free-standing III-V compound semiconductor sidewall fins without the need of anchoring structures remains needed.

SUMMARY

The present application provides a method of forming III-V compound semiconductor sidewall fin-type channels in a gate last process flow. In the present application, the III-V compound semiconductor channels are formed after removal of a sacrificial gate structure (i.e., replacement gate structure), thus eliminating the need for anchoring structures that are employed in the art to prevent fin collapse. In addition, because the III-V compound semiconductor channels in the present application are formed at a later fabrication stage and after performing high temperature processes, such as thermal processes for formation of source/drain regions, the damages to the III-V compound semiconductor channels caused by high processing temperature can be prevented. After forming a sacrificial gate structure straddling a stacking of a semiconductor mandrel structure and a dielectric mandrel cap and spacers present on sidewalls of the stack, portions of the spacers located on opposite sides of the sacrificial gate structure are removed. Epitaxial source/drain regions are formed on exposed sidewalls of portions of the semiconductor mandrel structure located on opposite sides of the sacrificial gate structure. The sacrificial gate structure is removed to provide a gate cavity. Next, portions of the spacers exposed by the gate cavity are removed to expose sidewalls of a portion of the semiconductor mandrel structure. III-V compound semiconductor channel portions are then formed on exposed sidewalls of the semiconductor mandrel structure. Portions of the semiconductor mandrel structure and the dielectric mandrel cap exposed by the gate cavity are subsequently removed from the structure, leaving only the III-V compound semiconductor channel portions.

In one aspect of the present application, a method of forming a semiconductor structure is provided. The method includes forming a sacrificial gate structure straddling a portion of a vertical stack of a semiconductor mandrel structure and a dielectric mandrel cap that is located over a substrate and a portion of a spacer present on each sidewall of the vertical stack. Portions of each spacer that are not covered by the sacrificial gate structure are then removed to expose sidewalls of portions of the semiconductor mandrel structure that are not covered by the sacrificial gate structure. Next, epitaxial source/drain regions are formed on the exposed sidewalls of the portions of the semiconductor mandrel structure. After forming an interlevel dielectric (ILD) layer over the epitaxial source/drain regions and the substrate to laterally surround the sacrificial gate structure, the sacrificial gate structure is removed to provide a gate cavity. Next, a portion of each spacer located within the gate cavity is removed. A compound semiconductor channel portion is then formed on each sidewall of a portion of the semiconductor mandrel structure located within the gate cavity. After removing the portion of the semiconductor mandrel structure and an overlying portion of the dielectric mandrel cap located within the gate cavity, a functional gate structure is formed in the gate cavity.

In another aspect of the present application, a semiconductor structure is provided. The semiconductor structure includes a compound semiconductor channel portion laterally surrounded by epitaxial source/drain regions, and a function gate structure straddling an entirety of the compound semiconductor channel portion and consisting of a stack of, from bottom to top, a gate dielectric, a gate electrode and a gate cap.

BRIEF DESCRIPTION OF THE DRAWINGS

FIG. 2A is a top-down view of the exemplary semiconductor structure of FIG. 1A after patterning the hard mask layer and a top semiconductor layer of the SOI substrate to form stacks of semiconductor mandrel structures and dielectric mandrel caps.

FIG. 2B is a cross-sectional view of the exemplary semiconductor structure of FIG. 2A along line B-B'.

FIG. 4A is a top-down view of the exemplary semiconductor structure of FIG. 3A after forming sacrificial gate structures straddling portions of the stacks of semiconductor mandrel structures and dielectric mandrel caps and the spacers.

FIG. 4B is a cross-sectional view of the exemplary semiconductor structure of FIG. 4A along line B-B'.

FIG. 4C is a cross-sectional view of the exemplary semiconductor structure of FIG. 4A along line C-C'.

FIG. 5A is a top-down view of the exemplary semiconductor structure of FIG. 4A after removing portions of the spacers that are not covered by the sacrificial gate structures to expose sidewalls of portions of the semiconductor mandrel structures.

FIG. 5B is a cross-sectional view of the exemplary semiconductor structure of FIG. 5A along line B-B'.

FIG. 5C is a cross-sectional view of the exemplary semiconductor structure of FIG. 5A along line C-C'.

FIG. 6A is a top-down view of the exemplary semiconductor structure of FIG. 5A after forming epitaxial source/drain regions on the sidewalls of the exposed portions of the semiconductor mandrel structures.

FIG. 6B is a cross-sectional view of the exemplary semiconductor structure of FIG. 6A along line B-B'.

FIG. 6C is a cross-sectional view of the exemplary semiconductor structure of FIG. 6A along line C-C'.

FIG. 7A is a top-down view of the exemplary semiconductor structure of FIG. 6A after removing portions of the dielectric mandrel caps and the semiconductor mandrel structures that are not covered by the sacrificial gate structures.

FIG. 7B is a cross-sectional view of the exemplary semiconductor structure of FIG. 7A along line B-B'.

FIG. 7C is a cross-sectional view of the exemplary semiconductor structure of FIG. 7A along line C-C'.

FIG. 10A is a top-down view of the exemplary semiconductor structure of FIG. 9A after removing portions of the spacers exposed by the gate cavities.

FIG. 10B is a cross-sectional view of the exemplary semiconductor structure of FIG. 10A along line B-B'.

FIG. 10C is a cross-sectional view of the exemplary semiconductor structure of FIG. 10A along line C-C'.

FIG. 10D is a cross-sectional view of the exemplary semiconductor structure of FIG. 10A along line D-D'.

FIG. 11A is a top-down view of the exemplary semiconductor structure of FIG. 10A after forming compound semiconductor channel portions on sidewalls of portions of the semiconductor mandrel structures within the gate cavities.

FIG. 11B is a cross-sectional view of the exemplary semiconductor structure of FIG. 11A along line B-B'.

FIG. 11C is a cross-sectional view of the exemplary semiconductor structure of FIG. 11A along line C-C'.

FIG. 11D is a cross-sectional view of the exemplary semiconductor structure of FIG. 11A along line D-D'.

DETAILED DESCRIPTION

Figure 1A:
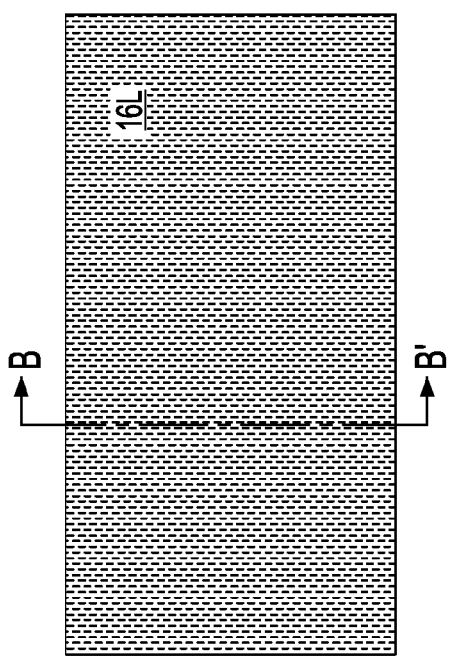
FIG. 1A is a top-down view of an exemplary semiconductor structure including a semiconductor-on-insulator substrate (SOI) and a hard mask layer formed thereon that can be employed according to an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1B:
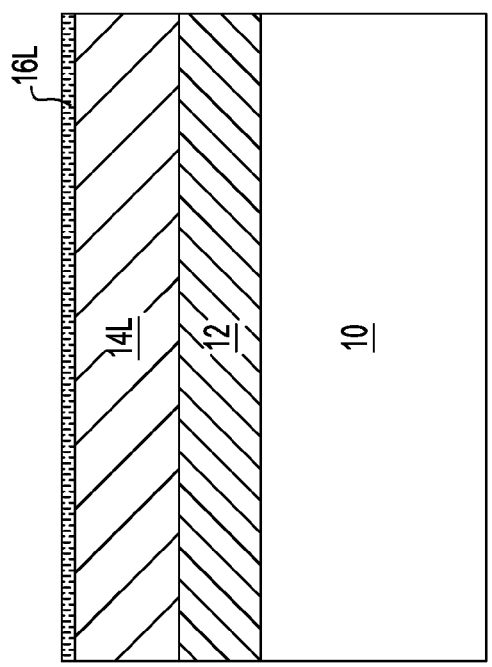
FIG. 1B is a cross-sectional view of the exemplary semiconductor structure of FIG. 1A along line B-B'.

Referring to FIGS. 1A and 1B, an exemplary semiconductor structure that can be employed in one embodiment of the present application includes a substrate having a hard mask layer 16L formed thereon. The substrate can be a semiconductor-on-insulator (SOI) substrate or a bulk semiconductor substrate including a bulk semiconductor material throughout. In one embodiment of the present application and as shown in FIG. 1, the substrate is a SOI substrate including, from bottom to top, a handle substrate 10, a buried insulator layer 12 and a top semiconductor layer 14L.

The handle substrate 10 may include a semiconductor material such as, for example, Si, Ge, SiGe, SiC, SiGeC, a III-V compound semiconductor, a II-VI compound semiconductor or any combinations thereof. The handle substrate 10 provides mechanical support to the buried insulator layer 12 and the top semiconductor layer. The thickness of the handle substrate 10 can be from 30 μm to about 2 mm, although less and greater thicknesses can also be employed.

The buried insulator layer 12 may include a dielectric material such as silicon dioxide, silicon nitride, silicon oxynitride, boron nitride or a combination thereof. In one embodiment, the buried insulator layer 12 may be formed by a deposition process, such as chemical vapor deposition (CVD), plasma enhanced chemical vapor deposition (PECVD) or physical vapor deposition (PVD) and then be bonded to a silicon wafer. In another embodiment, the buried insulator layer 12 may be formed using a thermal growth process, such as thermal oxidation, to convert a surface portion of the handle substrate 10. In yet another embodiment, the buried insulator layer 12 can also be formed by implanting oxygen atoms into a bulk semiconductor substrate and thereafter annealing the structure. The thickness of the buried insulator layer 12 can be from 50 nm to 200 nm, although lesser or greater thicknesses can also be employed.

The top semiconductor layer 14L may include Si, Ge, SiGe or SiGeC. The semiconductor materials of the top semiconductor layer 14L and the handle substrate 10 may be the same or different. In one embodiment, each of the handle substrate 10 and the top semiconductor layer 14L comprises a single crystalline semiconductor material, such as, for example, single crystalline silicon. The top semiconductor layer 14L can be formed by a deposition process, such as CVD or PECVD, or it can represent an uppermost portion of a bulk substrate in which oxygen atoms used to form the buried insulating layer 12 are implanted therein. The top semiconductor layer 14L that is formed may have a thickness from 10 nm to 200 nm, although lesser or greater thicknesses can also be employed. Alternatively, the top semiconductor layer 14L may be formed using a smart cut process where two semiconductor wafers are bonded together with an insulator in between.

The hard mask layer 16L that is formed on the top semiconductor layer 14L (or the topmost semiconductor surface of a bulk substrate) can include a dielectric material. In one embodiment, the hard mask layer 16L is composed of a metal oxide such as, for example, $Al_2O_3$. The hard mask layer 16L can be formed by conventional deposition processes, such as, for example CVD or PECVD. The thickness of the hard mask layer 16L can be from 5 nm to 20 nm, although lesser and greater thicknesses can also be employed.

Referring to FIGS. 2A and 2B, the vertical stack of the top semiconductor layer 14L and the dielectric cap layer 16L is patterned to form stacks, each including a semiconductor mandrel structure 14 which is a remaining portion of the top semiconductor layer 14L and a dielectric mandrel cap 16 which is a remain portion of the hard mask layer 16L. Each of the semiconductor mandrel structure 14 and the dielectric mandrel cap 16 can have a rectangular shape and laterally extend along a lengthwise direction. As used herein, a lengthwise direction of a structure refers to the direction along which the structure extends the most. Each of the semiconductor mandrel structures 14 and the dielectric mandrel caps 16 can have a width measured in a direction perpendicular to the lengthwise direction ranging from 10 nm to 100 nm, although lesser and greater widths can also be employed.

Patterning the vertical stack of the top semiconductor layer 14L and the hard mask layer 16L can be performed, for example, by applying a photoresist layer (not shown) over the top surface of the hard mask layer 16L, lithographically patterning the photoresist layer, and transferring the pattern in the photoresist layer into the hard mask layer 16L and the top semiconductor layer 14L by an anisotropic etch such as a reactive ion etch (RIE). After lithographic patterning, the patterned photoresist layer can be removed utilizing a conventional resist stripping process such as, for example, ashing.

Figure 3A:
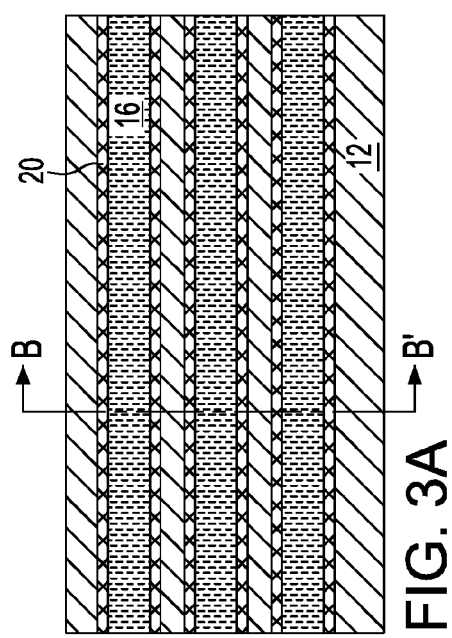
FIG. 3A is a top-down view of the exemplary semiconductor structure of FIG. 2A after forming spacers on sidewalls of the stacks of semiconductor mandrel structures and dielectric mandrel caps.
Figure 3B:
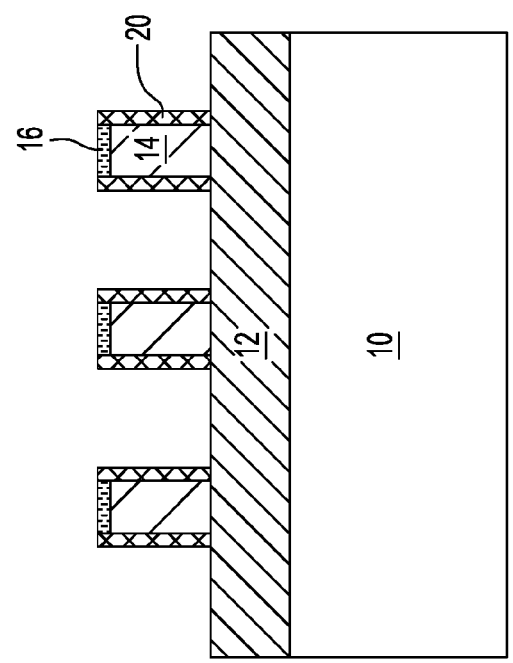
FIG. 3B is a cross-sectional view of the exemplary semiconductor structure of FIG. 3A along line B-B'.

Referring to FIGS. 3A and 3B, spacers 20 are formed on sidewalls of the vertical stacks of the semiconductor mandrel structures 14 and the dielectric mandrel caps 16. The spacers 20 can be formed by depositing a spacer material layer (not shown) on physically exposed surfaces of the mandrel structures 14, the dielectric mandrel caps 16 and the buried insulator layer 12. The spacer material layer can include a dielectric material, and can be formed employing a conformal deposition method such as CVD or atomic layer deposition (ALD). In one embodiment, the spacer material layer includes a dielectric oxide such as, for example, silicon dioxide. The thickness of the spacer material layer can be from 5 nm to 30 nm, although lesser and greater thicknesses can also be employed. Subsequently, horizontal portions of the spacer material layer are removed utilizing an anisotropic etch, forming the spacers 20 on the exposed sidewalls of the semiconductor mandrel structures 14 and the dielectric mandrel caps 16.

Referring to FIGS. 4A-4C, sacrificial gate structures (i.e., replacement gate structures) 22 are formed straddling portions of the vertical stacks of semiconductor mandrel structures 14 and dielectric mandrel caps 16 and the spacers 20. The term "sacrificial gate structure" as used herein refers to a placeholder structure for a functional gate structure to be subsequently formed. Thus, the dimension of the sacrificial gate structure determines the dimension of the functional structure later formed. The term "functional gate structure" as used herein refers to a permanent gate structure used to control output current (i.e., flow of carriers in the channel) of a semiconducting device through electrical fields.

The sacrificial gate structures 22 can be formed by deposition and patterning a sacrificial gate material layer (not shown) that is formed over the vertical stacks of semiconductor mandrel structures 14 and dielectric mandrel caps 16, the spacers 20 and the buried insulator layer 12. The sacrificial gate material layer can include a dielectric nitride such as, for example, silicon nitride or a dielectric oxide such as, for example, silicon dioxide and can be deposited by CVD or PECVD. The thickness of the sacrificial gate material layer that is formed can be from 30 nm to 100 nm, although lesser and greater thicknesses can also be employed. The patterning of the sacrificial gate material layer can be effected by application of a photoresist layer (not shown) over the sacrificial gate material layer, lithographic patterning of the photoresist layer, transfer of the pattern in the photoresist layer into the sacrificial gate material layer, and removal of the patterned photoresist layer, for example, by ashing. Remaining portions of the sacrificial gate material layer constitute the sacrificial gate structures 22. Each sacrificial gate structure 22 may have a width ranging from 15 nm to 35 nm, although lesser and greater widths can also be employed.

In conventional practice, the sacrificial gate structures are typically formed from, for example, amorphous silicon (a-Si) or polysilicon and not from a dielectric material, as in case of the present application; and because the sacrificial gate structure in the present application is composed of a dielectric material, no gate spacers need to be present on the sidewalls of the sacrificial gate structures.

Referring to FIGS. 5A-5C, portions of the spacers 20 that are not covered by the sacrificial gate structures 22 are removed, for example, by an anisotropic etch. The anisotropic etch can be a dry etch such as, for example, RIE or a wet etch that removes the dielectric material that provides the spacers 20 selective to the dielectric materials that provide the buried insulator layer 12, the dielectric mandrel caps 16 and the sacrificial gate structures 22 as well as the semiconductor material that provides the semiconductor mandrel structures 14. Remaining portions of the spacers 20 that are located beneath the sacrificial gate structures 22 are herein referred to as spacer portions 20P. The removal of the exposed portions of the spacers 20 re-exposes the sidewalls of portions of the semiconductor mandrel structures 14 that are located between the sacrificial gate structures 22.

Referring to FIGS. 6A-6C, an epitaxial source region and an epitaxial drain region (collectively referred to epitaxial source/drain regions 30) are formed on the sidewalls of the exposed portions of the semiconductor mandrel structures 14 located between the sacrificial gate structures 22.

The epitaxial source/drain regions 30 can be formed by epitaxially depositing a semiconductor material over the exposed semiconductor surfaces, such as the sidewall surfaces of the exposed portions of the semiconductor mandrel structures 14, but not on dielectric surfaces such as the surfaces of the sacrificial gate structures 22, the dielectric mandrel caps 16 and the buried insulator layer 12. The crystal orientation of the sidewalls of the semiconductor mandrel structures 14 can be tailored for specific purpose. For example, it may be desirable to have a (111) crystal orientation for growing InGaAs on silicon.

The semiconductor material that can be epitaxially deposited includes Si, SiGe, SiC or a III-V compound semiconductor such as InAs, AlAs, GaAs, InP, GaN, InGaAs, InAlAs, GaSb, AlSb, AlP, GaP or InSb. The semiconductor material of the epitaxial source/drain regions 30 can be deposited as an intrinsic semiconductor material, or can be deposited with in-situ doping. If the semiconductor material is deposited as an intrinsic semiconductor material, the epitaxial source/drain regions 30 can be subsequently doped (ex-situ) utilizing ion implantation, gas phase doping or dopant out diffusion from a sacrificial dopant source material. For a p-type FET, the epitaxial source/drain regions 30 can be doped with p-type dopants and for an n-type FET, the source/drain regions 30 can be doped with n-type dopants. Exemplary p-type dopants include, but are not limited to, B, Al, Ga or In. Exemplary n-type dopants include, but are not limited to, P, As or Sb. The p-type dopants or n-type dopants can be activated subsequently using a rapid thermal process. In one embodiment, the epitaxial deposition of the semiconductor material may be continued until the epitaxial source/drain regions 30 formed merge adjacent semiconductor mandrel structures 14 (not shown).

Referring to FIGS. 7A-7C, portions of the dielectric mandrel caps 16 and the semiconductor mandrel structures 14 that are not covered by the sacrificial gate structures 22 are removed, for example, by an anisotropic etch. The anisotropic etch can be a dry etch such as, for example, RIE or a wet etch that removes the semiconductor mandrel structures 14 and dielectric mandrel caps 16 selected to the epitaxial source/drain regions 30, the sacrificial gate structures 22 and the buried insulator layer 12. Each remaining portion of the dielectric mandrel caps 16 located beneath one of the sacrificial gate structures 22 is herein referred to as a dielectric mandrel cap portion 16P. Each remaining portion of the semiconductor mandrel structures 14 located beneath one of the sacrificial gate structures 22 is herein referred to as a semiconductor mandrel structure portion 14P.

Figure 8A:
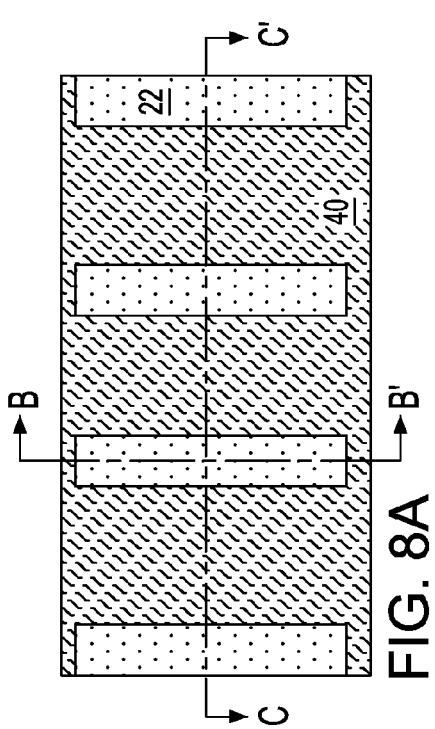
FIG. 8A is a top-down view of the exemplary semiconductor structure of FIG. 7A after forming an interlevel dielectric (ILD) layer over the epitaxial source and drain regions and a buried insulator layer of the SOI substrate to surround the sacrificial gate structures.
Figure 8C:
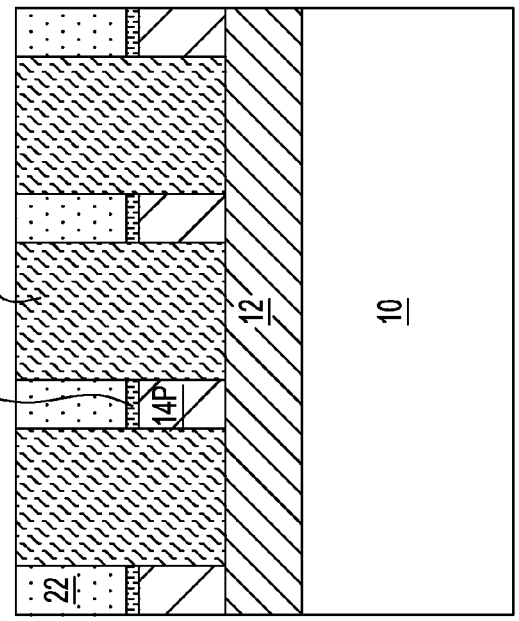
FIG. 8C is a cross-sectional view of the exemplary semiconductor structure of FIG. 8A along line C-C'.
Figure 8B:
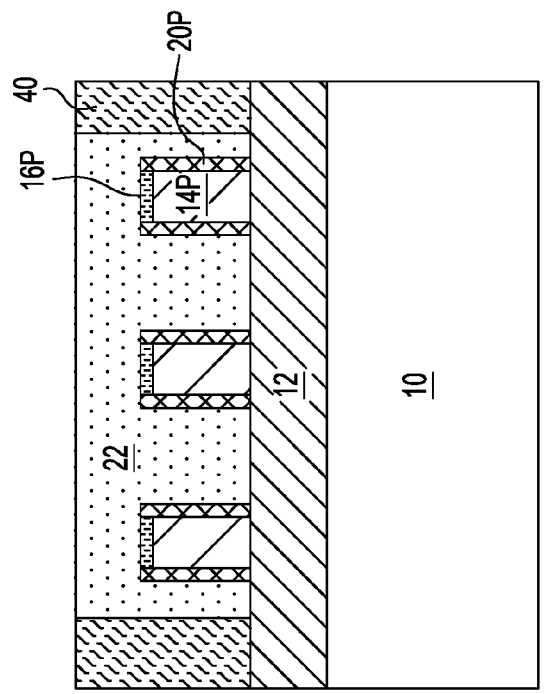
FIG. 8B is a cross-sectional view of the exemplary semiconductor structure of FIG. 8A along line B-B'.
Figure 9A:
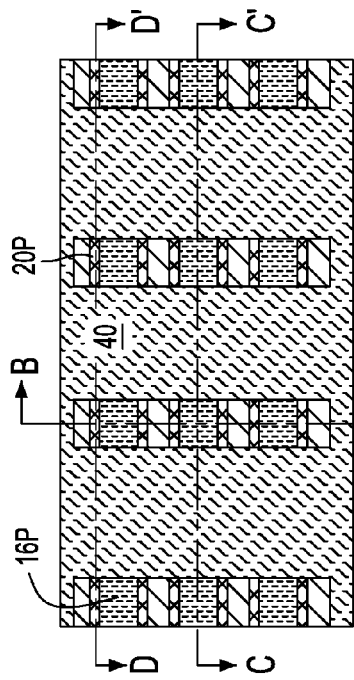
FIG. 9A is a top-down view of the exemplary semiconductor structure of FIG. 8A after removing the sacrificial gate structures to form gate cavities.
Figure 9B:
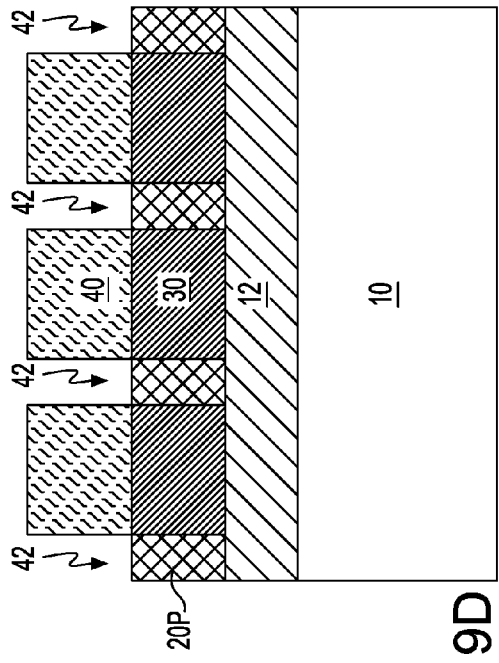
FIG. 9B is a cross-sectional view of the exemplary semiconductor structure of FIG. 9A along line B-B'.
Figure 9C:
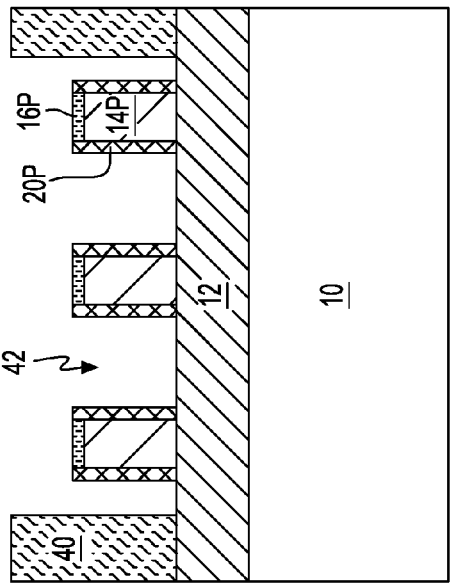
FIG. 9C is a cross-sectional view of the exemplary semiconductor structure of FIG. 9A along line C-C'.
Figure 9D:
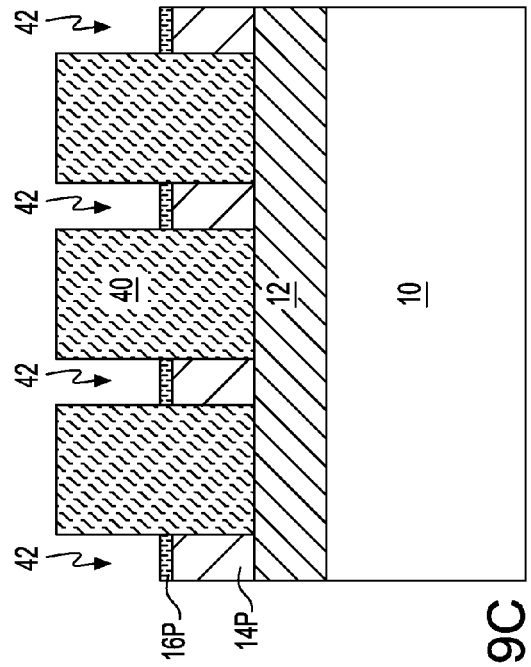
FIG. 9D is a cross-sectional view of the exemplary semiconductor structure of FIG. 9A along line D-D'.
Figure 12A:
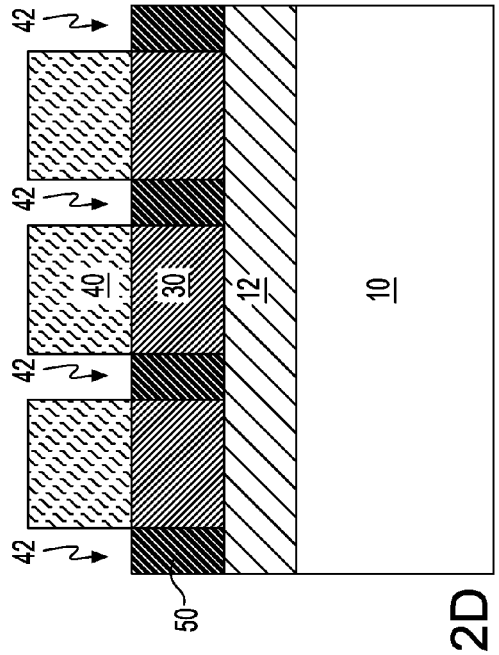
FIG. 12A is a top-down view of the exemplary semiconductor structure of FIG. 11A after removing the portions of the semiconductor mandrel structures and portions of the dielectric mandrel caps within the gate cavities.
Figure 12B:
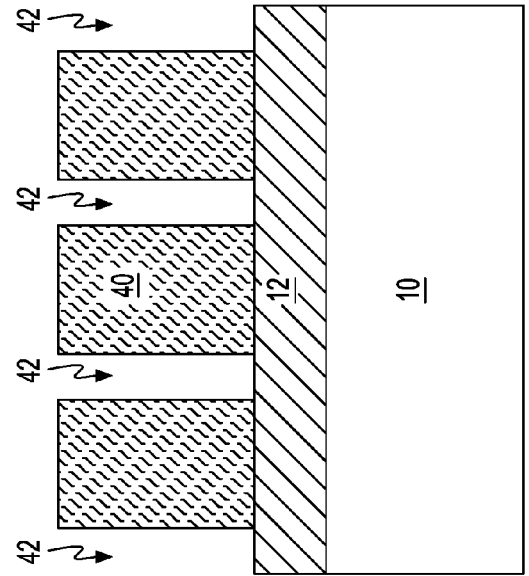
FIG. 12B is a cross-sectional view of the exemplary semiconductor structure of FIG. 12A along line B-B'.
Figure 12C:
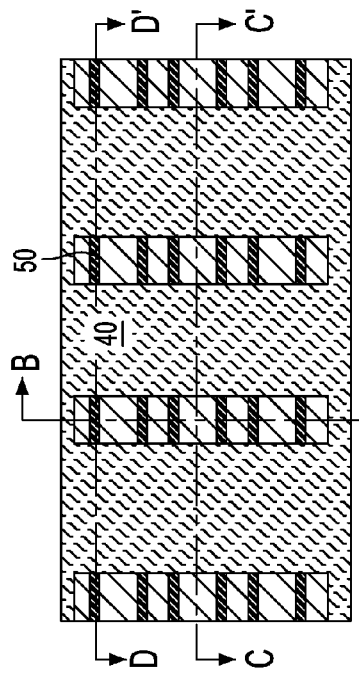
FIG. 12C is a cross-sectional view of the exemplary semiconductor structure of FIG. 12A along line C-C'.
Figure 12D:
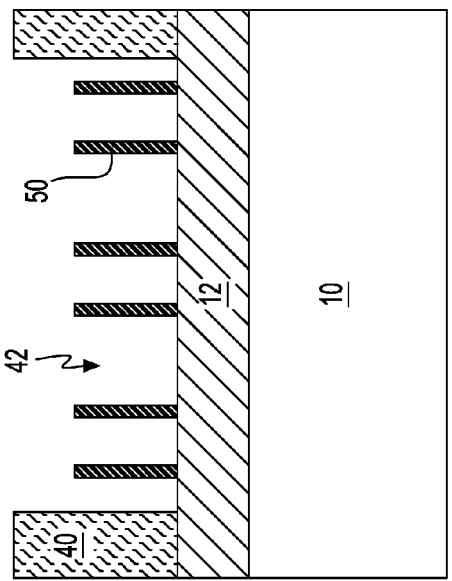
FIG. 12D is a cross-sectional view of the exemplary semiconductor structure of FIG. 12A along line D-D'.
Figure 13A:
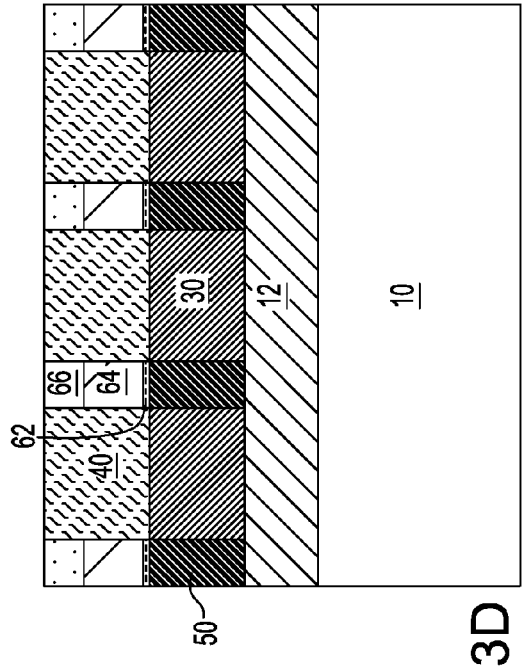
FIG. 13A is a top-down view of the exemplary semiconductor structure of FIG. 12A after forming functional gate structures in the gate cavities.
Figure 13B:
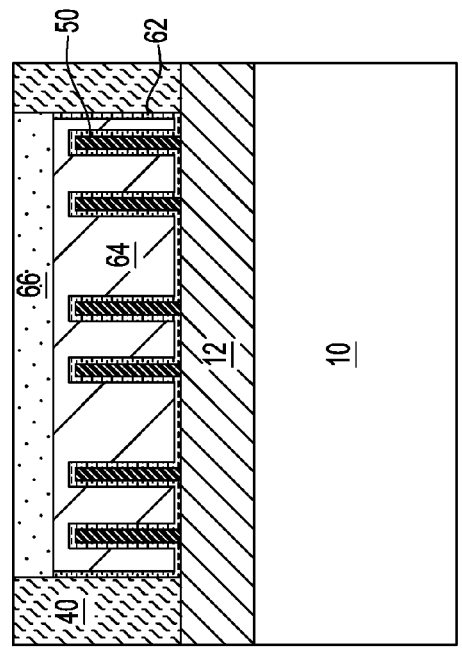
FIG. 13B is a cross-sectional view of the exemplary semiconductor structure of FIG. 13A along line B-B'.
Figure 13C:
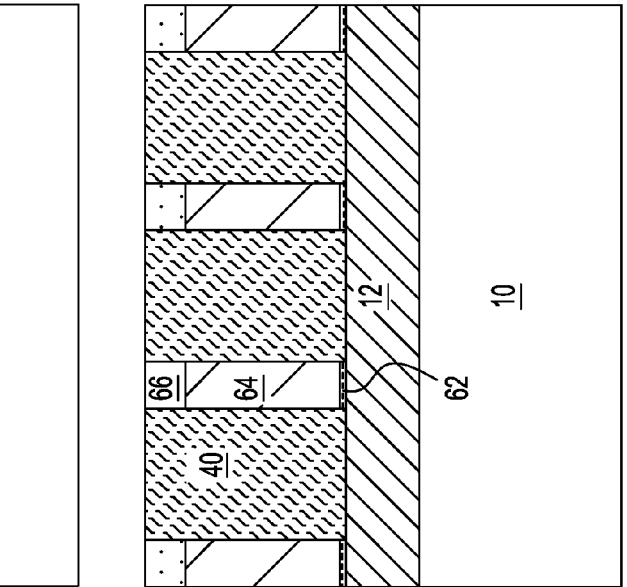
FIG. 13C is a cross-sectional view of the exemplary semiconductor structure of FIG. 13A along line C-C'.
Figure 13D:
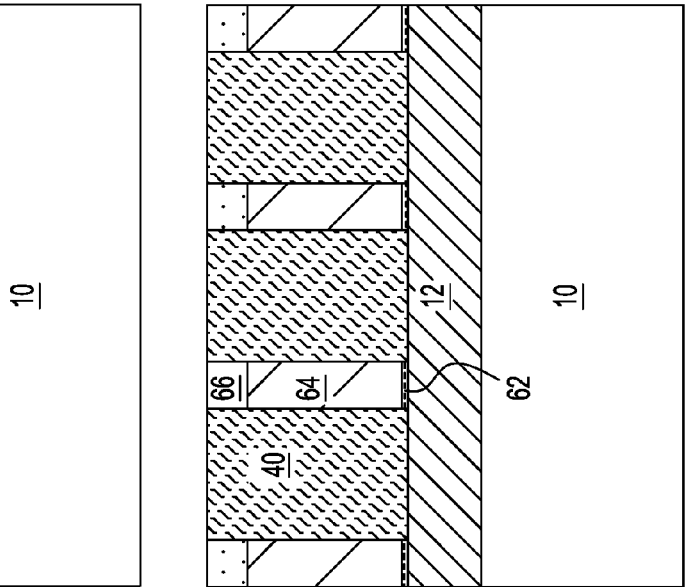
FIG. 13D is a cross-sectional view of the exemplary semiconductor structure of FIG. 13A along line D-D'.
Figure 14D:
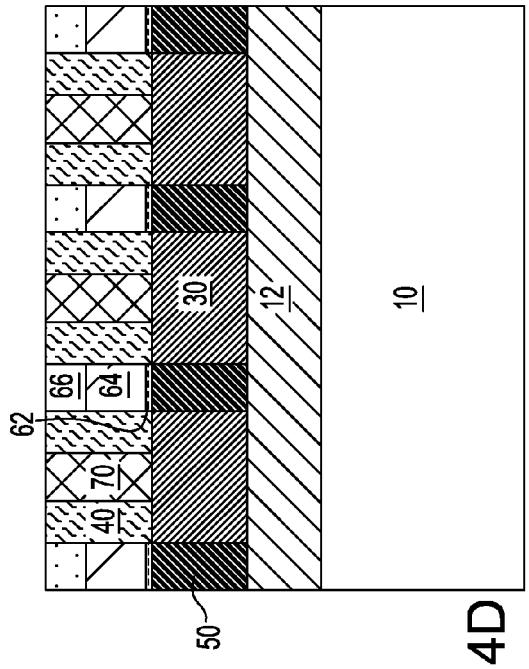
FIG. 14D is a cross-sectional view of the exemplary semiconductor structure of FIG. 14A along line D-D'.
Figure 14C:
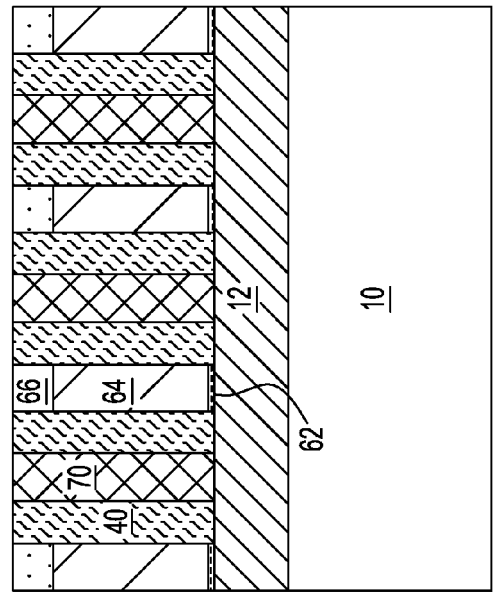
FIG. 14C is a cross-sectional view of the exemplary semiconductor structure of FIG. 14A along line C-C'.
Figure 14A:
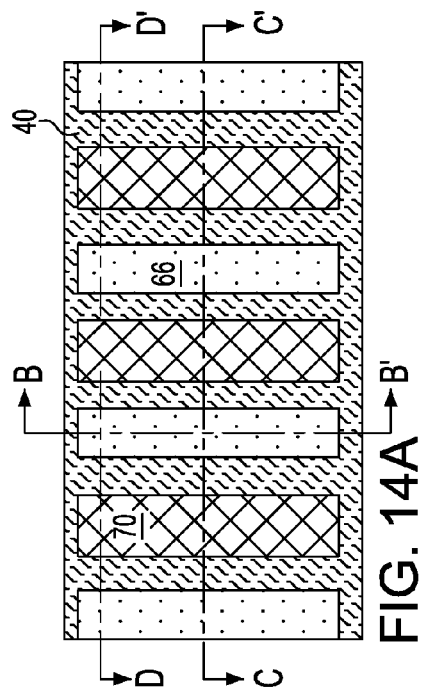
FIG. 14A is a top-down view of the exemplary semiconductor structure of FIG. 13A after forming source/drain contact structures.
Figure 14B:
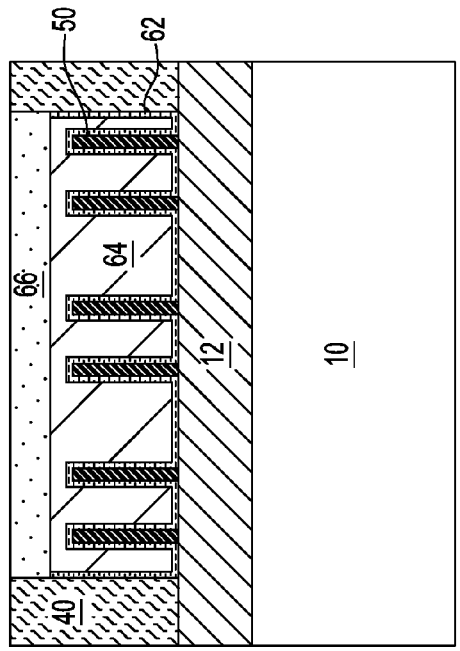
FIG. 14B is a cross-sectional view of the exemplary semiconductor structure of FIG. 14A along line B-B'.

Referring to FIGS. 8A-8C, an interlevel dielectric (ILD) layer 40 is deposited over the epitaxial source and drain regions 30 and the buried insulator layer 12 to surround the sacrificial gate structures 22. The ILD layer 40 includes a dielectric material that can be easily planarized. In one embodiment, the ILD layer 40 is composed of a dielectric oxide such as, for example, silicon dioxide. The ILD layer 40 can be deposited using a conventional deposition process such as, for example, CVD, PECVD or spin coating. If the ILD layer 40 is not self-planarizing, following the deposition of the ILD layer 40, the ILD layer 40 can be subsequently planarized, for example, by chemical mechanical planarization (CMP) and/or a recess etch. In one embodiment, the sacrificial gate structures 22 can be employed as an etch stop such that after planarization, the top surface of the ILD layer 40 is coplanar with the top surfaces of the sacrificial gate structures 22.

Referring to FIGS. 9A-9D, the sacrificial gate structures 22 are removed to provide gate cavities 42. Each of the gate cavities 42 occupies a volume from which a corresponding sacrificial gate structure 22 is removed such that each gate cavity 42 is laterally confined by the ILD layer 40. The sacrificial gate structures 22 can be removed selectively to the buried insulator layer 12, the semiconductor mandrel structure portions 14P, the dielectric mandrel cap portions 16P, the spacer portions 20P and the ILD layer 40 by an etch. The etch can be a dry etch and/or a wet etch. In one embodiment and when the sacrificial gate structures 22 are composed of silicon nitride, a wet etch using, for example, phosphoric acid can be employed to remove the sacrificial gate structures 22. The removal of the sacrificial gate structures 22 exposes the spacer portions 20P previously covered by the sacrificial gate structures 22.

Referring to FIGS. 10A-10D, the spacer portions 20P exposed by the gate cavities 42 are removed by an etch that removes the spacer portions 20P selective to the buried insulator layer 12, the mandrel structure portions 14P, the dielectric mandrel cap portions 16P and the ILD layer 40. The etch can be an isotropic etch or an anisotropic etch such as RIE. The removal of the spacer portions 20P exposes sidewalls of the semiconductor mandrel structure portions 14P located within the gate cavities 42.

Referring to FIGS. 11A-11D, compound semiconductor channel portions 50 are formed by selective epitaxial deposition of a compound semiconductor material directly on the exposed sidewalls of the semiconductor mandrel structure portions 14P. During the selective epitaxy process, the deposited compound semiconductor material grows only on exposed semiconductor surfaces, such as the sidewalls of the semiconductor mandrel structure portions 14P, but does not grow on dielectric surfaces, such as surfaces of the dielectric mandrel cap portions 16P, the ILD layer 40 and the buried insulator layer 12.

In one embodiment, the compound semiconductor material that provides the compound semiconductor channel portions 50 can be a III-V compound semiconductor material such as, for example, InGaAs, InAs, GaAs or InP. In one embodiment, the compound semiconductor material can be a single crystalline III-V compound semiconductor material that contacts, and is in epitaxial alignment with, the single crystalline material of the semiconductor mandrel structure portions 14P. For example, the compound semiconductor material can be single crystalline GaAs or single crystalline InGaAs. In one embodiment and when the epitaxial source/drain regions 30 include a III-V compound semiconductor material, the III-V compound semiconductor material that provides the compound semiconductor channel portions 50 can be the same as, or different from, the III-V compound semiconductor material that provides the epitaxial source/drain regions 30.

The compound semiconductor channel portions 50 can be formed as an intrinsic semiconductor material, or can be formed with in-situ doping of dopants having a conductivity type opposite to that of dopants in the epitaxial source/drain regions 30. For example and when the epitaxial source/drain regions 30 has a doping of n-type conductivity, the compound semiconductor channel portions 50 can have a doping of p-type conductivity, and vice versa. If the compound semiconductor channel portions 50 are doped, the dopant concentration within the compound semiconductor channel portions 50 can be in a range from $1.0 \times 10^{14}/cm^3$ to $3.0 \times 10^{18}/cm^3$, although lesser and greater dopant concentrations can also be employed. The width of each of the compound semiconductor channel portions 50 can be in a range from 3 nm to 30 nm, although lesser and greater widths can also be employed. The selective epitaxy process can continue until top surfaces of the compound semiconductor channel portions 50 are coplanar with the top surfaces of the dielectric mandrel cap portions 16P.

Referring to FIGS. 12A-12D, the semiconductor mandrel structure portions 14P and the dielectric mandrel cap portions 16P are removed by at least one etch, leaving the compound semiconductor channel portions 50 protruding from the buried insulator layer 12. The etch can be an anisotropic etch such as RIE that removes the semiconductor mandrel structure portions 14P and the dielectric mandrel cap portions 16P selective to the compound semiconductor channel portions 50, the ILD layer 40 and the buried insulator layer 12.

In the present application, since the III-V semiconductor channel portions 50 and epitaxial source/drain regions 30 are held by the ILD layer 40 after removal of the semiconductor mandrel structure portions 14P and the dielectric mandrel cap portions 16P, the fin collapse caused by the removal of the mandrel structures in the prior art in instances where no anchoring structures are present can be prevented.

Referring to FIGS. 13A-13D, functional gate structures are formed in the gate cavities 42. Each functional gate structure straddles an entirety of one of the compound semiconductor channel portions 50 and may include, from bottom to top, a gate dielectric 62, a gate electrode 64 and a gate cap 66. Thus, each functional gate structure (62, 64, 66) is in direct contact with sidewalls and top surfaces of the compound semiconductor channel portions 50. Sidewalls of each functional gate structure (62, 64, 66) are in direct contact with the ILD layer 40.

The gate dielectric 62 can be formed by depositing a conformal gat dielectric layer (not shown) on exposed surfaces (i.e., sidewalls and top surfaces) of the compound semiconductor channel portions 50 and within the gate cavities 42. The gate dielectric layer can be a high dielectric constant (high-k) material layer having a dielectric constant greater than 8.0. Exemplary high-k materials include, but are not limited to, $HfO_2$, $ZrO_2$, $La_2O_3$, $Al_2O_3$, $TiO_2$, $SrTiO_3$, $LaAlO_3$ and $Y_2O_3$. In one embodiment, the gate dielectric layer includes $HfO_2$. The gate dielectric layer can be formed by a conventional deposition process including, but not limited to, CVD, PVD, ALD, molecular beam epitaxy (MBE), ion beam deposition, electron beam deposition, and laser assisted deposition. The gate dielectric layer that is formed may have a thickness ranging from 0.9 nm to 6 nm, although lesser and greater thicknesses can also be employed. The gate dielectric layer may have an effective oxide thickness on the order of or less than 1 nm.

The remaining volume of each gate cavity 42 is then filled with a gate electrode layer (not shown). Exemplary metals that can be employed in the gate electrode layer include, but are not limited to, tungsten, titanium, tantalum, aluminum, nickel, ruthenium, palladium and platinum. In one embodiment, the gate electrode layer is comprised of tungsten. The gate electrode layer can be formed utilizing a conventional deposition process including, for example, CVD, PECVD, PVD, or ALD.

In some embodiment of the present application, and prior to the formation of the gate electrode layer, a work function metal layer (not shown) may be conformally deposited over the gate dielectric layer employing CVD, PVD or plating. The work function metal layer includes a metal having a work function suitable to tune the work function of FETs subsequently formed. The thickness of the work function metal layer can be from 3 nm to 15 nm, although lesser and greater thicknesses can also be employed.

Portions of the gate electrode layer and the gate dielectric layer that are formed above the top surface of the ILD layer 40 can be removed, for example, by CMP. In some embodiments and as illustrated, remaining portions of the gate electrode layer and the gate dielectric layer may be recessed utilizing a dry etch or a wet etch to provide a void (not shown) within each gate cavity 42. After recess, each remaining portion of the gate electrode layer constitutes the gate electrode 64, and each remaining portion of the gate dielectric layer constitutes the gate dielectric 62.

A dielectric material is then deposited over the gate dielectric 62 and the gate electrode 64 in each gate cavity 42 to completely fill the void. The deposited dielectric material is then planarized, for example, by CMP using the top surface of the ILD layer 40 as an etch stop to form the gate cap 66. The top surfaces of the gate caps 66 thus are coplanar with the top surface of the ILD layer 40. Exemplary dielectric materials that can be employed in the gate cap 66 include, but are not limited to, silicon nitride, silicon carbide nitride, and silicon boron carbonitride. In one embodiment, each of the gate caps 66 includes silicon nitride.

Referring to FIGS. 14A-14D, source/drain contact structures 70 are formed through the ILD layer 40 so as to contact the epitaxial source/drain regions 30. The source/drain contact structures 70 can be formed by formation of contact openings (not shown) in the ILD layer 40 utilizing a combination of lithographic patterning and anisotropic etch followed by deposition of a conductive material (e.g., copper) and planarization that removes an excess portions of the conductive material from above the top surface of the ILD layer 40. Optionally, contact liners (not shown) may be formed on the sidewalls and bottoms surfaces of the contact openings before filling the contact openings with the conductive material. The contact liners may include TiN.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
   forming a sacrificial gate structure straddling a portion of a vertical stack of a semiconductor mandrel structure and a dielectric mandrel cap that is located over a substrate and a portion of a spacer present on each sidewall of the vertical stack;
   removing portions of each spacer that are not covered by the sacrificial gate structure to expose sidewalls of portions of the semiconductor mandrel structure that are not covered by the sacrificial gate structure;
   forming epitaxial source/drain regions on the exposed sidewalls of the portions of the semiconductor mandrel structure;

forming an interlevel dielectric (ILD) layer over the epitaxial source/drain regions and the substrate to laterally surround the sacrificial gate structure;

removing the sacrificial gate structure to provide a gate cavity;

removing a portion of each spacer located within the gate cavity;

forming a compound semiconductor channel portion on each sidewall of a portion of the semiconductor mandrel structure located within the gate cavity;

removing the portion of the semiconductor mandrel structure and an overlying portion of the dielectric mandrel cap located within the gate cavity; and forming a functional gate structure in the gate cavity.

2. The method of claim 1, further comprising forming the vertical stack of the semiconductor mandrel structure and the dielectric mandrel cap, wherein the forming the vertical stack of the semiconductor mandrel structure and the dielectric mandrel cap comprises:

forming a hard mask layer over a top semiconductor layer of a semiconductor-on-insulator substrate; and patterning the hard mask layer and the top semiconductor layer, wherein a remaining portion of the top semiconductor layer forms the semiconductor mandrel structure and a remaining portion of the hard mask layer forms the dielectric mandrel cap.

3. The method of claim 1, wherein the dielectric mandrel cap comprises $Al_2O_3$.

4. The method of claim 1, wherein the semiconductor mandrel structure comprises Si.

5. The method of claim 1, wherein the forming the sacrificial gate structure comprises:

forming a sacrificial gate material layer over the vertical stack of the semiconductor mandrel structure and the dielectric mandrel cap, each spacer and the substrate; and patterning the sacrificial gate material layer.

6. The method of claim 5, wherein the sacrificial gate material layer comprises silicon nitride or dielectric oxide.

7. The method of claim 1, wherein the epitaxial source/drain regions are formed by selective epitaxial deposition of a semiconductor material.

8. The method of claim 7, wherein the epitaxial source/drain regions comprise SiGe, SiC or a III-V compound semiconductor material.

9. The method of claim 1, wherein each compound semiconductor channel portion is formed by a selective epitaxial deposition of a III-V compound semiconductor material.

10. The method of claim 9, wherein each compound semiconductor channel portion comprises InGaAs, InAs, GaAs or InP.

11. The method of claim 9, wherein the III-V compound semiconductor material of the compound semiconductor channel portion is different from a semiconductor material of the source/drain regions.

12. The method of claim 1, wherein the functional gate structure consists of a stack comprising, from bottom to top, a gate dielectric, a gate electrode and a gate cap.

13. The method of claim 12, wherein the forming the functional gate structure comprising:

forming a gate dielectric layer over sidewalls and a bottom surface of the gate cavity and over the ILD layer;

forming a gate electrode layer in the gate cavity and over the ILD layer;

removing portions of the gate electrode layer and the gate dielectric layer from a top surface of the ILD layer;

recessing remaining portions of the gate electrode layer and the gate dielectric layer to provide a void; and filling the void with a dielectric material to provide the gate cap.

14. The method of claim 1, further comprising removing the portions of the semiconductor mandrel structures and overlying portions of the dielectric mandrel cap that are not covered by the sacrificial gate structure after forming the epitaxial source/drain regions.

* * * * *